US012670938B2

(12) United States Patent　　　　　(10) Patent No.: US 12,670,938 B2

Milirud et al.　　　　　　　　　　　(45) Date of Patent: Jun. 30, 2026

(54) SAMPLE AND HOLD CIRCUIT AND METHOD FOR ANALOG-TO-DIGITAL CONVERSION

(71) Applicant: Avago Technologies International Sales Pte. Limited, Singapore (SG)

(72) Inventors: Vadim Milirud, Lake Forest, CA (US); Guansheng Li, Irvine, CA (US); Seong-Ho Lee, Irvine, CA (US); Jun Cao, Irvine, CA (US); Yong Liu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 513 days.

(21) Appl. No.: 18/103,696

(22) Filed: Jan. 31, 2023

(65) Prior Publication Data

US 2024/0257847 A1　　Aug. 1, 2024

(51) Int. Cl.
| | |
|---|---|
| *G11C 7/16* | (2006.01) |
| *G11C 7/10* | (2006.01) |
| *G11C 7/22* | (2006.01) |

(52) U.S. Cl.
CPC .............. *G11C 7/16* (2013.01); *G11C 7/1039* (2013.01); *G11C 7/222* (2013.01)

(58) Field of Classification Search
CPC ........... G11C 7/1039; G11C 7/16; G11C 7/22; G11C 7/222; G11C 27/02; G11C 27/022; G11C 27/024; G11C 27/026; G11C 27/028; H03M 1/12; H03M 1/124; H03M 1/1245
See application file for complete search history.

(56) References Cited

U.S. PATENT DOCUMENTS

| | | | | |
|---|---|---|---|---|
| 6,642,751 | B1 * | 11/2003 | Quinn ................. | G11C 27/026 327/337 |
| 7,986,256 | B2 * | 7/2011 | Yamamoto .......... | H03M 1/1245 341/158 |
| 2002/0190774 | A1 * | 12/2002 | Manganaro ......... | H03K 5/1515 327/291 |
| 2003/0234641 | A1 * | 12/2003 | Bottomley .......... | G11C 27/026 324/76.42 |
| 2006/0202735 | A1 | 9/2006 | Aksin et al. | |

(Continued)

OTHER PUBLICATIONS

Pei et al: "Design of a 10-bit, 50MSPS pipeline CMOS ADC", Computer, Mechatronics, Control and Electronic Engineering (CMCE), 2010 International Conference on, IEEE, USA, Aug. 24, 2010 (Aug. 24, 2010), pp. 41-44, XP031781007, ISBN: 978-1-4244-7957-3 (Year: 2010).*

(Continued)

*Primary Examiner* — Huy Q Phan
*Assistant Examiner* — David B Frederiksen
(74) *Attorney, Agent, or Firm* — Foley & Lardner LLP

(57) ABSTRACT

Described herein are systems and methods related to a device including an analog-to-digital converter (DAC) configured to convert a digital signal into an analog signal. The systems and methods can receive an analog signal at a first input, and provide the analog signal to a first output in response to a first clock signal. The first clock signal has a level at least partially dependent on the analog signal. The systems and methods can provide a path to a ground node for the first clock signal in response to a second clock signal. The second clock signal is independent of the analog signal.

21 Claims, 5 Drawing Sheets

(56) References Cited

U.S. PATENT DOCUMENTS

| | | | | |
|---|---|---|---|---|
| 2018/0269892 | A1* | 9/2018 | Kurose | H04B 1/40 |
| 2019/0162759 | A1* | 5/2019 | Poletto | H03F 3/45179 |
| 2019/0207617 | A1* | 7/2019 | Xavier | H03M 1/1245 |
| 2019/0222207 | A1* | 7/2019 | Soundararajan | H03K 5/249 |
| 2020/0358450 | A1* | 11/2020 | Pentakota | H03M 1/38 |
| 2021/0320669 | A1* | 10/2021 | Tetsuka | H03M 1/1245 |

OTHER PUBLICATIONS

European Search Report on non-Foley case related to U.S. Appl. No. 18/103,696 DTD Jun. 27, 2024.

Xiaomin Pei et al: "Design of a 10-bit, 50MSPS pipeline CMOS ADC", Computer, Mechatronics, Control and Electronic Engineering (CMCE), 2010 International Conference on, IEEE, USA, Aug. 24, 2010 (Aug. 24, 2010), pp. 41-44, XP031781007, ISBN: 978-1-4244-7957-3 * figure 6 *.

* cited by examiner

100

SAMPLE AND HOLD CIRCUIT AND METHOD FOR ANALOG-TO-DIGITAL CONVERSION

FIELD OF THE DISCLOSURE

This disclosure generally relates to systems and methods for analog-to-digital conversion, and more particularly to a sample and/or hold operation for analog-to-digital conversion.

BACKGROUND

An analog-to-digital converter (ADC) is a circuit that can convert a first signal in an analog representation into a second signal in a digital representation. The first signal can represent a value (e.g., one or more of voltages, currents, frequencies, or any combination of them). The first signal in an analog representation (or an analog signal) may indicate a value of data from a continuous range of values, where the second signal in a digital representation (or a digital signal) may indicate a value of data from a finite set of values (e.g., one or more bits). ADCs are used in various circuitry including transceivers (e.g., radio frequency (RF) transceivers), computing devices, sensors, etc. Sample and hold circuits are often used in logic level high speed, logic level high resolution ADCs to sample the analog signal and hold the sampled analog signal at its level for its conversion to the digital signal.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
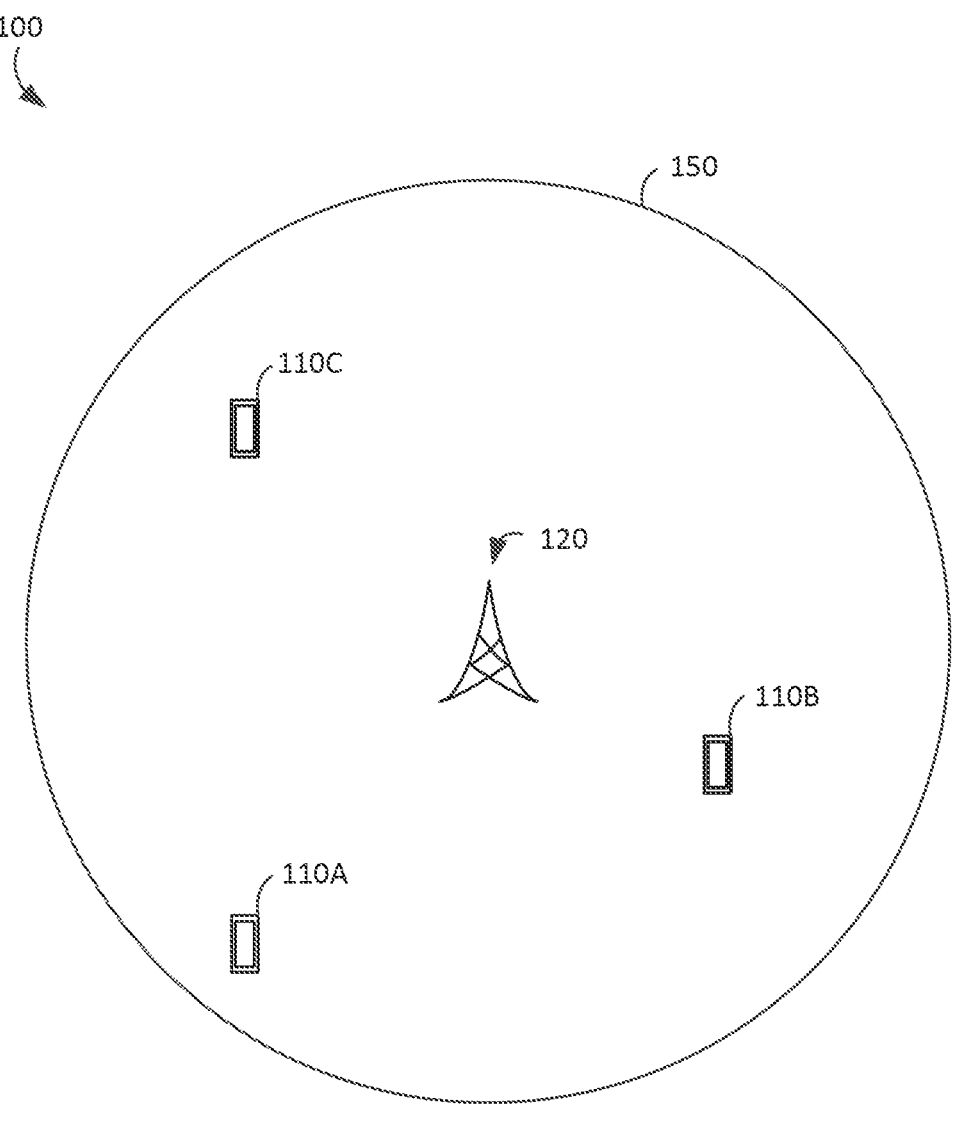
FIG. 1 is a schematic block diagram of a communication system including a base station and client devices, in accordance with some embodiments.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, relative terms, such as "below," "lower," "above," "cupper" "top," "bottom" and the like, may be used herein for ease of description to describe one element, signal characteristic or feature's relationship to another element(s), characteristic, or feature(s) as illustrated in the figures.

In some embodiments, a sampler, sample and hold, or track and hold (T/H) circuit is used in a high resolution and high-speed ADC. The circuit is configured as a top plate sampling circuit having a linearity above nine bits (e.g., 11-12 bit of linearity) over wide frequency range. In some embodiments, the sampler, sample and hold, or T/H circuit is utilized in a 5 G or above device. In some embodiments, systems and methods provide top-plate bootstrapped sampling that overcomes bottom-plate sampling drawbacks and achieves higher speed and bandwidth. Sampling or sample may refer to an operation where a signal is taken at a particular time. A sample may be taken to measure an instantaneous values of continuous-time signal in some embodiments.

In some embodiments, systems and methods provide a clock scheme that enables logic level high speed operation. Robust performance over process, voltage and temperature corners can be achieved in some embodiments. In some embodiments, the circuit for implementing the sample and hold operations can be provided in a smaller area and at lower power than conventional circuits. The systems and methods achieve higher integration and larger signal to noise ratio (SNR) for smaller input signals and power in some embodiments.

In some embodiments, systems and methods provide top-plate bootstrapped sampling that is distortion free or relatively distortion free while achieving the high speed and high-bandwidth (e.g., speed and bandwidth associated with 5G applications, millimeter wave applications, etc.). In some embodiments, systems and methods are employed in an ADC provided in a receiver for a communication device, computing device or sensor.

Some embodiments relate to a device. The device includes a first circuit configured to provide a first clock signal. The first clock signal has a first level above a level of a power node coupled to the first circuit and a second level. The device also includes a second circuit coupled to the first circuit. The second circuit is configured to sample a second signal at a first input in response to the first clock signal. The second circuit includes a first transistor. The first transistor is configured to receive the first clock signal and is configured as a current source to provide a path to a ground node for the first clock signal in response to a second clock signal when the second signal at the first input is above a fourth voltage level below the third voltage level.

In some embodiments, the second circuit includes a second transistor and a third transistor configured to disconnect a first node from the first transistor in response to the second clock signal. The first clock signal is provided to the first node by the first circuit. In some embodiments, the fourth voltage level is equal to the third voltage level minus a threshold voltage of the first transistor and a threshold voltage of the second transistor which is in series with the first transistor.

In some embodiments, the first circuit includes a voltage doubler circuit. The voltage doubler circuit is responsive to a third clock signal. The third clock signal is an inverted signal of the second clock signal. In some embodiments, the voltage doubler circuit includes an inverter configured to receive the third clock signal and provide a fourth clock signal. The fourth clock signal is delayed and inverted with respect to the third clock signal. In some embodiments, the voltage doubler circuit is coupled to a second transistor and a third transistor. The second transistor and the third transistor are in series with a capacitor, and the third transistor is configured to receive the fourth clock signal.

In some embodiments, the first circuit includes a voltage doubler circuit. The voltage doubler circuit is responsive to a third clock signal, and the third clock signal being an inverted signal of the second clock signal. The voltage doubler circuit includes an inverter configured to receive the third clock signal and provide a fourth clock signal. The fourth clock signal is delayed and inverted with respect to the third clock signal, and the voltage doubler circuit is coupled to a fourth transistor and a fifth transistor. The fourth transistor and the fifth transistor are disposed in series with a capacitor. The fourth transistor is configured to receive the fourth clock signal, and the fifth transistor is coupled to the first node. In some embodiments, the second circuit includes a sixth transistor coupled between the first input and the fourth transistor. The sixth transistor is configured to disconnect the fourth transistor from the first input in response to the first clock signal. In some embodiments, the first transistor is coupled in series with a fourth transistor. The fourth transistor is a PMOS transistor, and the first transistor is an NMOS transistor. The first transistor and the fourth transistor each have a gate coupled to receive the second clock signal.

In some embodiments, the second circuit includes a second transistor, a third transistor, and a fourth transistor configured to disconnect a first node from the first transistor in response to the second clock signal. The second clock signal is provided to the first node by the first circuit. The third transistor and the fourth transistor are in series. A second node between the third transistor and the fourth transistor is coupled to a gate of the second transistor and a drain of the fourth transistor. A gate of the fourth transistor receives the second clock signal. The fourth transistor is a PMOS transistor, and the third transistor is an NMOS transistor.

Some embodiments relate to a device. The device includes a first input configured to receive an analog signal and a first transistor coupled to the first input. The first transistor is configured to provide the analog signal to a first output in response to a first clock signal. The first clock signal has a level at least partially dependent on the analog signal. The device also includes a second transistor and a first circuit configured to provide the first clock signal. The second transistor between the first circuit and the first transistor. The second transistor is configured provide a path to a ground node for the first clock signal in response to the second clock signal. The second clock signal is independent of the analog signal.

In some embodiments, the second transistor is coupled to a current source. In some embodiments, the first circuit includes a fourth transistor and a third transistor configured to disconnect a first node from the current source in response to the second clock signal. In some embodiments, the second transistor comprises a gate coupled to a third transistor coupled to receive the second clock signal In some embodiments, the first circuit includes a voltage doubler circuit. The voltage doubler circuit is responsive to a third clock signal. The third clock signal is an inverted signal of the second clock signal. In some embodiments, the voltage doubler circuit includes an inverter configured to receive the third clock signal and provide a fourth clock signal. The fourth clock signal is delayed and inverted with respect to the third clock signal. In some embodiments, the third transistor is a PMOS transistor.

Some embodiments relate to a method of sampling an analog signal. The method includes receiving an analog signal at a first input, and providing the analog signal to a first output in response to a first clock signal. The first clock signal has a level at least partially dependent on the analog signal. The method also includes providing a path to a ground node for the first clock signal in response to a second clock signal. The second clock signal is independent of the analog signal.

In some embodiments, the path to ground comprises a current source.

In some embodiments, the method further includes disconnecting a first node from the path to ground in response to the second clock signal. The first node being coupled to a transistor configured to provide the first clock signal.

In some embodiments, the first clock signal is provided using a voltage doubler circuit.

In some embodiments, the method further includes inverting a third clock signal to provide the second clock signal. The voltage doubler circuit includes an inverter configured to receive the third clock signal and provide a fourth clock signal, wherein the fourth clock signal is delayed and inverted with respect to the third clock signal. A delay may refer to a phase delay in some embodiments. In some embodiments, a clock signal is delayed with respect to another clock signal if its rising or falling edge occurs after a respective rising or falling edge of the another clock signal.

FIG. 1 is a block diagram of a communication system 100 including a base station 120 and client devices 110A, 110B, 110C, in accordance with some embodiments. The base station 120 and the client devices 110A, 110B, 110C may communicate through a wireless communication link. A wireless communication link may be a cellular communication link conforming to 3G, 4G, 5G, 6G, or other cellular communication protocols. In one aspect, the client devices 110A . . . 110C are located within a geographical boundary 150 with respect to the base station 120, and may communicate with or through the base station 120. In some embodiments, the communication system 100 includes more, fewer, or different number of base stations 120 and/or client devices 110 than shown in FIG. 1.

In some embodiments, the client device 110 may be a user device such as a mobile phone, a smart phone, a personal digital assistant (PDA), tablet, laptop computer, wearable computing device (e.g., head mounted display, smart watch), a sensor, etc. A client device 110 may be also referred to as user equipment (UE). Each client device 110 may communicate with the base station 120 through a corresponding communication link. For example, the client device 110 may transmit or provide a wireless signal at RF to a base station 120 through a wireless communication link (e.g., 3G, 4G, 5G, 6G or other cellular communication link), and/or receive a wireless signal at RF from the base station 120 through the wireless communication link (e.g., 3G, 4G, 5G, 6G or other cellular communication link). A wireless signal may be a signal exchanged or provided through a wireless medium (e.g., air). The wireless signal may include or carry data such as audio data, image data, text, etc.

In some embodiments, the wireless signal is a millimeter wave signal and the client device 110 or base station 120 is a sensor. The sensor can be used an autonomous vehicle or autonomously assisted vehicle.

In some embodiments, the base station 120 may be a device configured to provide a wireless communication to client devices 110 within a geographical boundary 150. Examples of the base station 120 include eNB, gNB, etc. The base station 120 may be communicatively coupled to another base station 120 or other communication devices through a wireless communication link and/or a wired communication link. The base station 120 may receive a wireless signal at RF from a client device 110 or another base station 120 through a wireless communication link. Additionally or alternatively, the base station 120 may transmit or provide a wireless signal at RF to another client device 110, another base station 120, or another communication device through a wireless communication link. Hence, the base station 120 allows communication among client devices 110 associated with the base station 120, or other client devices 110 associated with different base stations 120.

Figure 2:
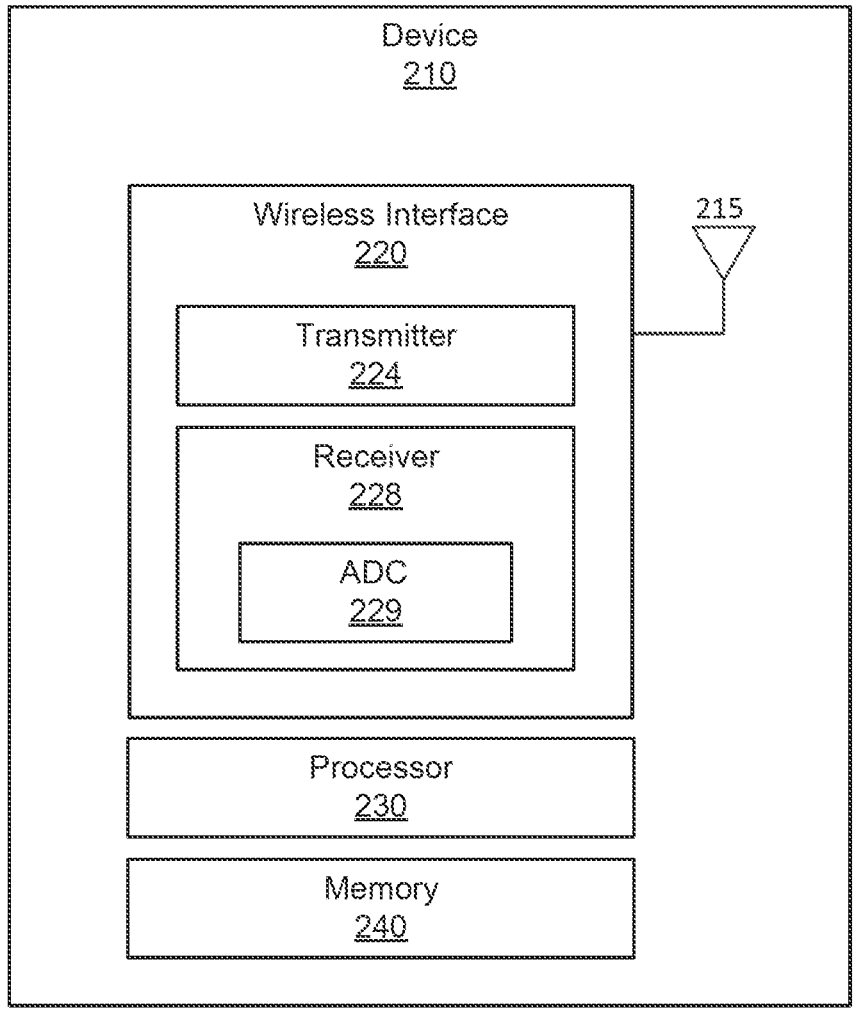
FIG. 2 is a schematic block diagram of a device for communication through a wireless communication link in the communication system illustrated in FIG. 1, in accordance with some embodiments.

FIG. 2 is a block diagram of a device 210 for communication through a wireless communication link, in accordance with some embodiments. In some embodiments, the device 210 may be the base station 120, the client device 110, or any device that can communicate through a wireless communication link. In some embodiments, the device 210 includes an antenna 215, a wireless interface 220, a processor 230, and a memory device 240. These components may be embodied as hardware, software, firmware, or a combination thereof. In some embodiments, the device 210 includes more, fewer, or different components than shown in FIG. 2. For example, the device 210 may include an electronic display and/or an input device. For example, the device 210 may include additional antennas 215 and additional wireless interfaces 220 than shown in FIG. 2.

In some embodiments, the antenna 215 is a component that may receive a wireless signal at RF and/or transmit a wireless signal at RF through a wireless medium (e.g., air). The antenna 215 may be a dipole antenna, a patch antenna, a ring antenna, or any suitable antenna for wireless communication. In one aspect, a single antenna 215 is utilized for both transmitting a wireless signal and receiving a wireless signal. For receiving a wireless signal, the antenna 215 may detect a wireless signal having a change in an electromagnetic wave in a wireless medium (e.g., air), and provide, to the wireless interface 220, an electrical signal at RF having a voltage and/or a current corresponding to the detected change in the electromagnetic wave. An electrical signal at RF may be referred to as a RF signal herein. For transmitting a wireless signal, the antenna 215 may receive, from the wireless interface 220, an electrical signal at RF having a voltage and/or a current, and transmit, through the wireless medium (e.g., air), a wireless signal having a change in an electromagnetic wave corresponding to the electrical signal. In some embodiments, different antennas 215 can be utilized for transmitting the wireless signal and receiving the wireless signal. In some embodiments, multiple antennas 215 can be utilized to support multiple-in, multiple-out (MIMO) communication.

In some embodiments, the wireless interface 220 is a circuit or a component that may provide a RF signal to the antenna 215 or receive a RF signal from the antenna 215. In some embodiments, the wireless interface 220 includes a transmitter 224 and a receiver 228. In some embodiments, the transmitter 224 and the receiver 228 may be implemented in a same integrated circuit. In some embodiments, the transmitter 224 and the receiver 228 may be implemented in different integrated circuits. A transmitter 224 may be a circuit or a component that generates or provides a RF signal for transmitting data. In one aspect, the transmitter 224 may receive a baseband signal including or representing data (e.g., audio data, image data, text, or any data) for transmission at a baseband frequency (e.g., 0~1 GHz) from the processor 230, and upconvert the baseband signal to generate a RF signal. The transmitter 224 may provide the RF signal to an antenna 215 for transmission. A receiver 228 may be a circuit or a component that receives a RF signal for receiving data. In one aspect, the receiver 228 may receive a RF signal from an antenna 215, and downconvert the RF signal to a baseband frequency (e.g., 0~1 GHz) to obtain a downconverted signal at the baseband frequency. The downconverted signal at the baseband frequency may include or represent data (e.g., audio data, image data, text, or any data) generated by another device (e.g., another base station 120, another client device 110, etc.). The receiver 228 may provide the downconverted signal to the processor 230. In one configuration, the transmitter 224 and the receiver 228 may be coupled to the same antenna 215. In one configuration, the transmitter 224 and the receiver 228 may be coupled to different antennas 215. In some embodiments, the RF signal is directly converted The processor 230 is a component that processes data. The processor 230 may be embodied as FPGA, ASIC, a logic circuit, etc. The processor 230 may obtain instructions from the memory device 240, and execute the instructions. In one aspect, the processor 230 may receive the downconverted signal at the baseband frequency or the directly converted signal from the wireless interface 220, and decode or process data included in or represented by the downconverted signal or directly converted. For example, the processor 230 may obtain audio data or image data from the downconverted signal. In one aspect, the processor 230 may generate or obtain data for transmission at the baseband frequency, and encode or process the data. For example, the processor 230 may encode or process image data or audio data at the baseband frequency, and provide a baseband signal including or representing the encoded or processed data to the wireless interface 220 for transmission.

The memory device 240 is a component that stores data. The memory device 240 may be embodied as RAM, flash memory, ROM, EPROM, EEPROM, registers, a hard disk, a removable disk, a CD-ROM, or any device capable for storing data. The memory device 240 may be embodied as a non-transitory computer readable medium storing instructions executable by the processor 230 to perform various functions of the device 210 disclosed herein. In some embodiments, the memory device 240 and the processor 230 are integrated as a single component (or an integrated circuit). In some embodiments, the memory device 240, the processor 230, and the wireless interface 220 are integrated as a single component (or an integrated circuit). In some embodiments, the memory device 240, the processor 230, and the wireless interface 220 are implemented as discrete components (or separate integrated circuits).

In some embodiments, receiver 228 includes an ADC 229 configured to convert an analog signal received by receiver 228 into a digital signal. ADC 229 can be any type of ADC including but not limited to a direct conversion ADC, successive approximation ADC, a sigma delta ADC, etc.

ADC 229 is implemented as an integrated circuit (IC) and can be provided in an IC package with receiver 228 or device 210.

Figures 3, 4:
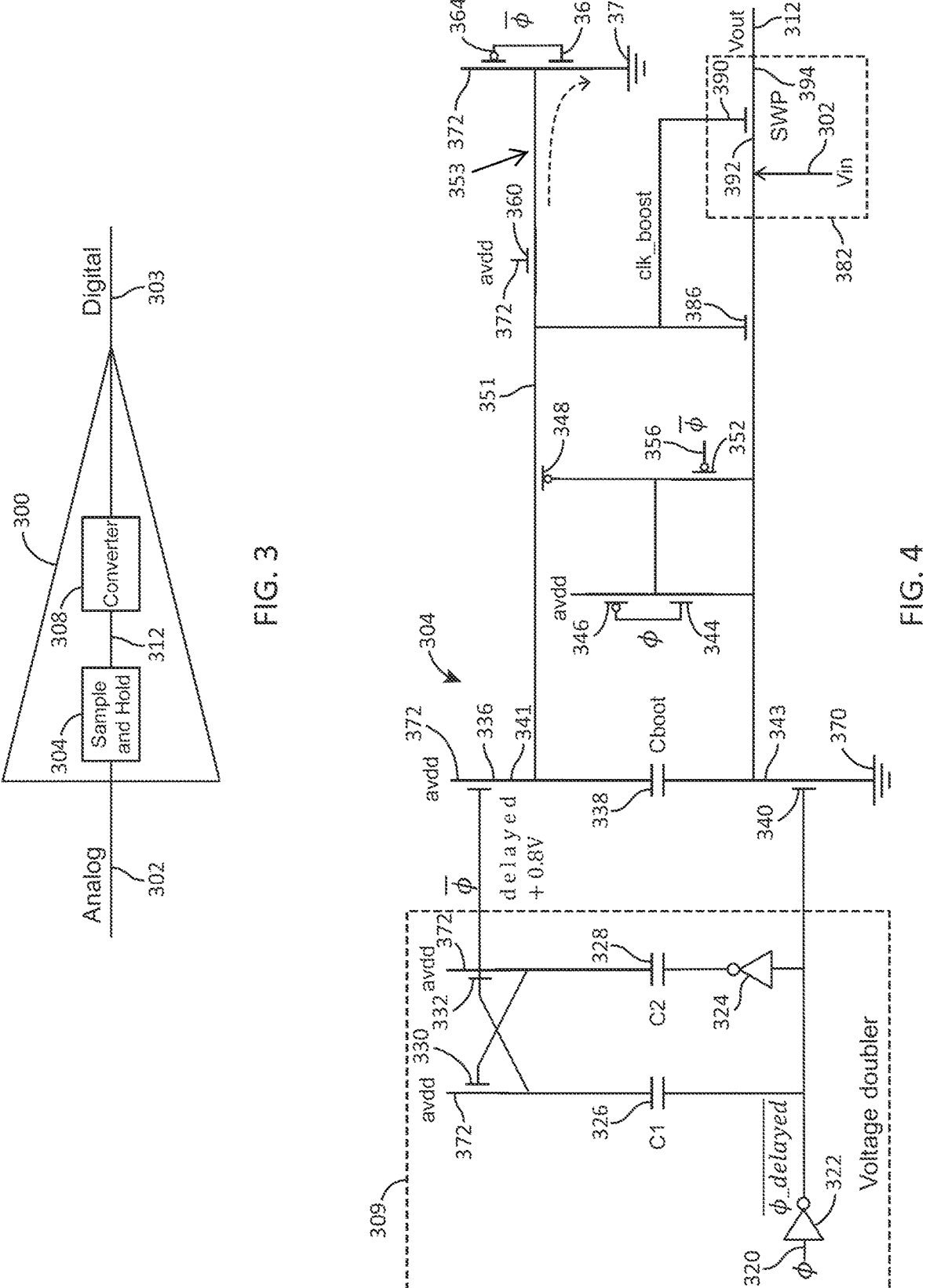
FIG. 3 is a schematic block diagram of an analog-to-digital converter (ADC) for use in the device illustrated in FIG. 2, in accordance with some embodiments.
FIG. 4 is an electrical schematic diagram of a sample and hold circuit for the ADC illustrated in FIG. 3, in accordance with some embodiments.

With reference to FIG. 3, an ADC 300 can be used as ADC 229 (FIG. 1). ADC 300 includes a sample and hold circuit 304 and a converter circuit or converter 308. Sample and hold circuit 304 receives an analog signal at an input 302 and provides a sampled signal at node or output 312 between converter 308 and sample and hold circuit 304. The analog signal is a sinusoidal signal in some embodiments. Converter 308 can employ a number of architectures to convert the sampled analog signal at output 312 to a digital signal at an output 303. For example, converter 308 can be a successive approximation converter (e.g., a successive-approximations (shift) register based architecture), a flash converter, a pipelined stage converter, and/or a sigma-delta (SD) converter. A sample and hold circuit may refer to any circuit that is configured to sample an analog signal and hold the signal at a sampled level for a predetermined period of time. In some embodiments, the predetermined period of time is long enough to allow for processing of the signal (e.g., to initiate or complete conversion of the sampled signal to the digital domain).

With reference to FIG. 4, sample and hold circuit 304 includes a voltage doubler circuit 309, a transistor 336, a capacitor 338, a transistor 340, a transistor 344, a transistor 346, a transistor 348, a transistor 352 with a gate 356, a transistor 360, a transistor 364, a transistor 368, a transistor 382, and a transistor 386. Sample and hold circuit 304 is configured as a distortion free top plate boot-strapped sampling circuit that achieves 11-12 bit linearity over a wide frequency range in some embodiments.

Transistor 382 is configured as a sampling transistor with a gate 390, a drain 392 coupled to input 302, and a source 394 coupled to output 312. A parasitic capacitance exists between output 312 and ground and serves as a hold capacitor in some embodiments. Alternatively, a capacitive component can be provided at output 312. In some embodiments, an input capacitor of a following buffer associated with converter 308 (FIG. 3) can be utilized for track and hold operations.

Voltage doubler circuit 309 includes a transistor 330, a capacitor 326, a capacitor 328, a transistor 332, an inverter 322 and an inverter 324. Voltage doubler circuit 309 is coupled to a voltage supply node 372 (e.g., avdd) and is configured as a cross coupled switched capacitor circuit. The voltage avdd is a 0.9 volt direct current (VDC) signal provided at node 372 in some embodiments. The voltage avdd can be other values. A voltage doubler circuit may refer to any circuit for increasing a voltage beyond a supply node voltage including but not limited to a boost converter, boost buck converter, flyback converter, Dickson charge pump, etc. The voltage doubler circuit can double, triple or increase the voltage level by any factor.

A clock signal φ is provided at a clock input 320. The clock signal is a sinusoidal, trapezoidal, square wave, or other signal having a logic level high level (e.g., avdd) and a low level (e.g., ground) in some embodiments. The clock signal φ can be provided by a clock circuit and can have a frequency associated with the sampling frequency of ADC 300 in some embodiments. The clock signal φ is inverted by inverter 322 and provided to capacitor 326 and inverter 324 as a clock signal φ' delayed. Inverter 322 delays the clock signal φ by an amount of time. In some embodiments, the amount of time is chosen to significantly reduce clock modulation and improve linearity. The non-delayed inverted form of clock signal φ is clock signal φ'.

When the clock signal φ' delayed is a low logic level, transistor 332 is turned off. At the same time the clock signal φ' delayed is provided to inverter 324 which inverts the signal and provides a clock signal φ' delayed clock at a high logic level. When clock signal φ" delayed is logic level high, transistor 330 is turned on resulting in capacitor 326 being charged to avdd. When φ' delayed is a high logic level, the top plate of capacitor 326 is pushed up to approximately twice avdd (e.g., the clock signal φ' delayed +8V). At the same time, transistor 332 is turned on, allowing capacitor 328 to charge. On the next half cycle of the clock signals φ' delayed and φ" delayed, the operations of transistors 330, 332, 339 and 340 are reversed and node 341 is supplied with approximately twice the voltage level of avdd (e.g. voltage of clock signal φ' delayed plus 0.8V) alternately from each side of the voltage doubler circuit 309.

The voltage across capacitor 338 which is a boost capacitor is provided as a clock boost signal to gate 390 of transistor 382 via transistor 348 in some embodiments. The clock boost signal is generally between ground and avdd plus the voltage input signal at input 302 (Vin). The clock boost signal is provided via nodes 341 to gate 390 of transistor 382. Transistor 340 connects node 343 to a ground node 370 when the clock signal φ' delayed is a logic level high (e.g., avdd). The clock boost signal controls sampling of the input signal (Vin) by transistor 382 in some embodiments. The clock boost signal has a timing generally related to the 4 delayed clock signal.

Sample and hold circuit 304 receives the analog input signal (e.g., Vin) at input 302 at drain 392 of transistor 382. During a hold operation, transistor 382 is off and the signal Vin is stored using the parasitic capacitance associated with output 312. The signal at node 341 is a clock signal (e.g., clock boost signal) that controls transistors 382 and 386. At the beginning of the hold operation, the clock boost signal is initially driven to ground using transistor 368 configured as a current source. Transistor 368 can be configured to have a proper threshold voltage and common mode voltage to achieve current source operation. Transistor 368 acts as current source for sinking current, thereby achieving input signal independent sampling on a fixed time grid. In some embodiments, transistor 368 operates as a current source when the analog input signal voltage (e.g., Vin) is greater than avdd minus the threshold voltages of transistors 360 and 368. Transistor 368 is saturated when the clock boost signal is greater than avdd minus the threshold voltage of transistor 368 in some embodiments. In some embodiments, transistor 368 is configured as a current source before transistor 382 is turned off by providing proper common mode voltage and threshold voltage. Transistor 368 is turned off when the clock boost signal is less than avdd plus the threshold voltage of transistor 382 in some embodiments.

The clock boost signal has an OFF state or low logic level that is independent of the input signal (Vin) due to the control of transistor 368 and 364 by clock signal φ' in some embodiments. Transistor 368 is an NMOS transistor turned on and off by clock signal φ'. Transistor 364 is a PMOS transistor and is turned on and off by clock signal 4'. Transistor 364 has a fast turn on time which improves linearity in some embodiments. In some embodiments, the delay associated with the φ' delayed clock signal and the φ" delayed clock signal with respect to clock signal φ' ensure that transistor 368 discharges all voltages before transistors 335 and 340 are turn on.

Transistor 348 is a PMOS transistor controlled by transistor 352, 344 and 346 and provides the signal at node 341 as clock boost signal to the gate 390 when turned on in some embodiments. Transistors 346 and 344 are controlled by the clock signal φ. Transistors 346 and 356 are PMOS transistors and transistor 344 is an NMOS transistor in some embodiments. Transistor 356 has a fast turn on time which improves linearity in some embodiments. When the clock signal φ' is a logic high and the clock signal φ is a logic low, transistor 352 is off, transistor 344 is off, and transistor 346 is on which causes transistor 348 to disconnect node 341 from a node 351. When the clock signal φ' is a logic low and the clock signal φ is a logic high, transistor 352 is on, transistor 344 is on, and transistor 346 is off which causes transistor 348 to connect node 341 to node 351 in some embodiments.

When transistor 348 connects node 341 to 351, the clock boost signal is equal to the voltage at node 341 minus the threshold voltage of transistor 348. The clock boost signal causes transistor 382 to sample the input signal at input 302 when at this level in some embodiments. The voltage from gate 390 to source 394 is equal to the voltage of the clock boost signal minus the voltage of the input signal (Vin) in some embodiments. Using an internally generated clock (e.g., the φ' delayed clock signal and φ " delayed signal) significantly reduces signal to clock modulation and improves linearity in some embodiments. The clock signal at node 351 (e.g., the clock boost signal) is driven to ground using transistor 368 in some embodiments.

Transistor 340 is controlled by the clock signal φ' delayed and connects node 343 to ground node 370 in accordance with the signal after sampling of the input signal. Transistor 386 is controlled by the clock boost signal and disconnects node 343 from input 302 after sampling. By having transistors 340 and 336 controlled by the clock signal φ' delayed and having transistors 364 and 368 controlled by clock signal φ', all voltage can be discharged through transistor 368 before transistor 382 is turned off and the hold operation begins in some embodiments.

Transistor 360 has a gate connected to node 372. Transistor 360 is turned on when the difference between the signal at node 351 and a node 353 is greater than the threshold voltage of transistor 360. Transistor 360 is turned off when the difference between the signal at node 351 and a node 353 is less than the threshold voltage of transistor 360 in some embodiments.

Figure 5:
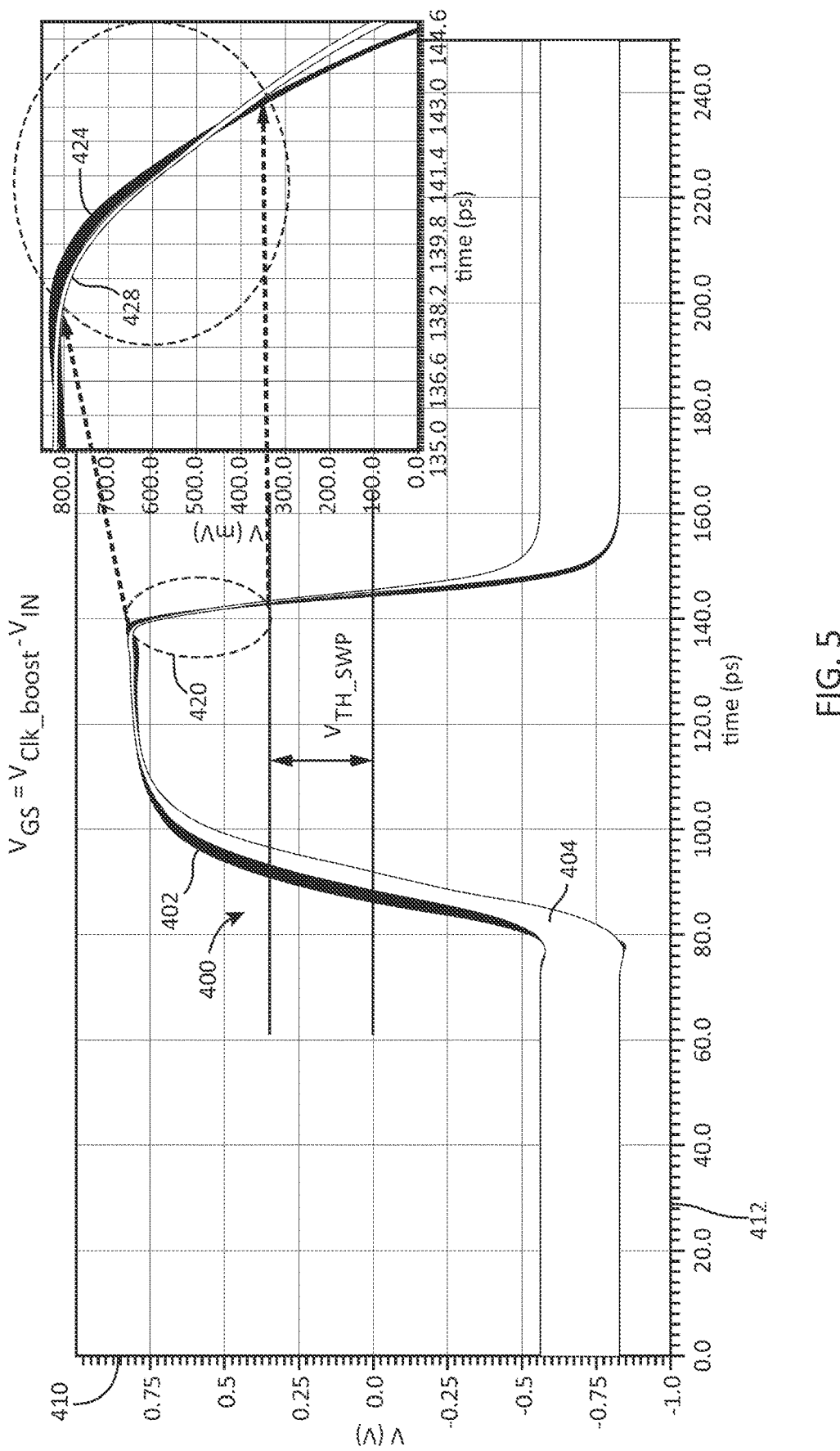
FIG. 5 is a waveform diagram of a gate to source voltage signal across a sampling transistor for the sample and hold circuit illustrated in FIG. 4 across various criteria or parameters, in accordance with some embodiments.

With reference to FIG. 5, a waveform 400 includes a portion 404 associated with the gate to source voltage of a sampling transistor (e.g., transistor 382) of circuit 304 (FIG. 4) and a portion 402 associated with the gate to source voltage of a sampling transistor of a conventional sample and hold circuit. Waveform 400 is an eye drawing representing samples across various parameters such as process parameters, temperature and voltage. Waveform 400 is provided on an X-axis 412 representing time in picoseconds and a Y-axis 410 representing voltage. Waveform 400 shows less jitter (e.g., signal dependency) in a transition region 420. Portion 424 associated with portion 402 is thicker than portion 428 associated with portion 404 showing more variability in region 420 when using a conventional signal and hold circuit in some embodiments.

Figure 6:
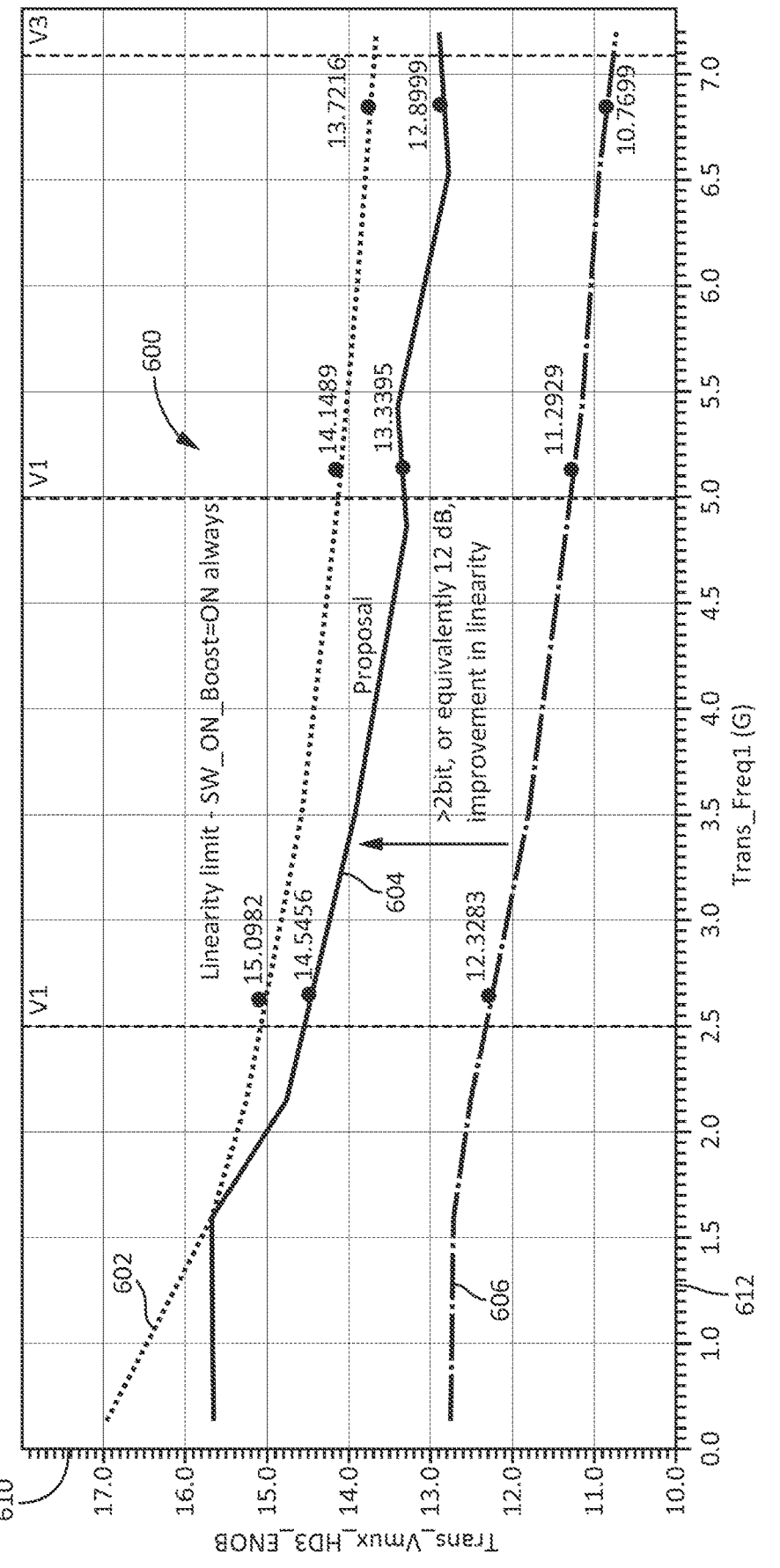
FIG. 6 is a waveform diagram of the effective number of bits versus frequency for an almost ideal sample and hold circuit, for the sample and hold circuit illustrated in FIG. 4, and a conventional for the sample and hold circuit, in accordance with some embodiments.

With reference to FIG. 6, waveform diagram 600 includes waveforms 602, 604 and 606. Waveforms 602, 604 and 606 are provided on an X-axis 612 representing equivalent number of bits and a Y-axis 410 representing effective number of bits (ENOB). Waveform 602 shows an almost ideal linearity limit. Waveform 604 shows linearity for the sample and hold circuit 304. Waveform 606 shows the linearity limit for a conventional sample and hold circuit. A 2 bit or greater linearity improvement can be achieved using sample and hold circuit 304 in some embodiments. The Y-axis for waveforms 602, 604 and 606 are in number of bits measured at full scale (−12 dBm) at a sampling frequency of 7.2 GHz.

The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. In some embodiments, the circuitry can be provided on one or more integrated circuit dies in an integrated circuit package. The integrated circuit package can be a combination of two or more packages in some embodiments.

In some embodiments, one or more components can be embodied, in whole or part, as one or more transistors. The transistors implemented may be N-type transistors or P-type transistors. N-type transistor is a transistor that utilizes electrons as majority carriers. P-type transistor is a transistor that utilizes holes as majority carriers. The transistors can be any suitable type of transistors including, but not limited to, metal oxide semiconductor field effect transistors (MOS-FETs), bipolar junction transistors (BJTs), high voltage transistors, high frequency transistors, FinFETs, planar MOS transistors with raised source/drains, nanosheet FETs, nanowire FETs, or the like. A PMOS transistor can refer to a transistor fabricated using an MOS process and utilizes holes as majority carriers in some embodiments. An NMOS transistor can refer to a transistor fabricated using an MOS process and utilizes electrons as majority carriers in some embodiments. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be referred to as source/drain electrodes. A gate electrode can refer to an electrode that receives a signal to turn or turn off a transistor or control a flow of charge carriers in the transistor in some embodiments. According to a voltage applied to a gate electrode of the transistor, current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

A clock circuit can provide a clock signal for various sampling and timing operations associated with ADC 300. The clock circuit can be part of ADC 300 or separate therefrom and can be any circuit for generating a clock signal (including periods of a first level and a second level (e.g., a periodic pulse signal of logic one and logic zero values or other voltage levels). A clock signal can be dependent on an analog input value. In some embodiments, the clock circuit is a logic circuit configured to provide a square wave clock signal or other logic signal with a duty cycle. The clock circuit can respond to a local oscillator or other frequency source and use flip flops or other logic to create the clock signal in some embodiments. A clock signal independent of an analog signal may refer to a clock signal that does not have levels affected by the state of the analog signal in some embodiments.

A node may refer to any location in a circuit where an electrical connection can be made in some embodiments. The connection can be by a contact, conductor, or other structure capable of making an electrical connection in some embodiments. The connection can be inherent in or integral to a structure of a component in some embodiments. A power node may refer to a location where a connection to a supply of power can be made in some embodiments. A ground node may refer to any type of node that is provided at a lower voltage level than a signal in some embodiments. In some embodiments, a ground node can be at a negative, positive, or zero voltage level. In some embodiments, a ground node may refer to a node that can sink current associated with a signal. A power node may refer to any type of node that is provided at a voltage level for powering one or more components in some embodiments. The term level can refer to a characteristic of a signals. In some embodiments, the characteristic is a magnitude in voltage or current. A clock signal may alternately be at a first level (e.g., avdd, Vdd, Vdd plus Vin) and a second level (e.g., avdd, ground, Vdd, Vin) in some embodiments.

A clock signal may refer to a signal that toggles between two voltages periodically (e.g. logic levels) in some embodiments. A clock cycle may refer to an amount of time for one period of the clock signal to be completed in some embodiments. A current source may refer to any circuit that delivers or absorbs an electric current which is relatively independent of the voltage across it some embodiments. A current source can be a current sink. A current source can include one or more transistors or diodes. A current source can be a transistor configured to operate in a particular operational region to achieve current sourcing capability. The configuration is not necessarily permanent and can be adjusted. For example, a current source can be a transistor that also operates as a switch in certain modes. A path may refer to any conductive connection and may include components such as resistors, capacitors or other devices in some embodiments.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical or electrical. The term in response to a signal may refer to a device or circuit performing an operation at least partially in response to a signal in some embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first circuit configured to provide a first clock signal, the first clock signal having a first voltage level and a second voltage level, the second voltage level being above a third voltage level of a power node coupled to the first circuit; and
a second circuit coupled to the first circuit, the second circuit configured to sample an input signal at a first input in response to a discharge, by a first transistor, of the first clock signal, wherein the first circuit comprises the first transistor, wherein the first transistor is configured to receive the first clock signal and is configured as a current source to provide a path to a ground node to discharge the first clock signal in response to a presence of a second clock signal and prior to sampling of the input signal by the second circuit, and wherein the first clock signal is delayed in accordance with a delay scheme that accounts for the second clock signal.

2. The device of claim 1, wherein the second circuit comprises a second transistor and a third transistor configured to disconnect a first node from the first transistor in response to the presence of the second clock signal, wherein the first node is coupled between the first circuit and the first transistor.

3. The device of claim 2, wherein the first circuit comprises a voltage doubler circuit, the voltage doubler circuit being responsive to a third clock signal, the third clock signal being an inverted signal of the second clock signal, wherein the voltage doubler circuit comprises an inverter configured to receive the third clock signal and provide a fourth clock signal, wherein the fourth clock signal is delayed and inverted with respect to the third clock signal, wherein the voltage doubler circuit is coupled to a fourth transistor and a fifth transistor, the fourth transistor and the fifth transistor being in series with a capacitor, wherein the fourth transistor is configured to receive the fourth clock signal, and the fifth transistor is coupled to the first node.

4. The device of claim 3, wherein the second circuit comprises a sixth transistor coupled between the first input and the fourth transistor, wherein the sixth transistor is configured to disconnect the fourth transistor from the first input in response to the first clock signal.

5. The device of claim 2, wherein the first transistor is coupled in series with a fourth transistor, the fourth transistor being a PMOS transistor and the first transistor being an NMOS transistor, wherein the first transistor and the fourth transistor each have a gate configured to receive the second clock signal.

6. The device of claim 1, wherein the first circuit comprises a voltage doubler circuit, the voltage doubler circuit being responsive to a third clock signal, the third clock signal being an inverted signal of the second clock signal.

7. The device of claim 6, wherein the voltage doubler circuit comprises an inverter configured to receive the third clock signal and provide a fourth clock signal, wherein the fourth clock signal is delayed and inverted with respect to the third clock signal.

8. The device of claim 7, wherein the voltage doubler circuit is coupled to a second transistor and a third transistor, the second transistor and the third transistor being in series with a capacitor, wherein the third transistor is configured to receive the fourth clock signal.

9. The device of claim 1, wherein the second circuit comprises a second transistor, a third transistor, and a fourth transistor configured to disconnect a first node from the first transistor in response to the second clock signal, wherein the first circuit is configured to provide the second clock signal to the first node, wherein the third transistor and the fourth transistor are in series and a second node between the third transistor and the fourth transistor is coupled to a gate of the second transistor and a drain of the fourth transistor, wherein a gate of the fourth transistor is configured to receive the second clock signal and the fourth transistor is a PMOS transistor and the third transistor is an NMOS transistor.

10. A device, comprising:
a first input configured to receive an analog signal;
a first transistor coupled to the first input and configured to provide the analog signal to a first output in response to a first clock signal, the first clock signal having a level at least partially dependent on the analog signal;
a second transistor; and
a first circuit configured to provide the first clock signal, wherein the second transistor is coupled between the first circuit and the first transistor, wherein the second transistor is configured to provide a path to a ground node to discharge the first clock signal in response to a presence of a second clock signal and prior to sampling of the analog signal by a second circuit, the second clock signal being independent of the analog signal, and wherein the first clock signal is delayed in accordance with a delay scheme that accounts for the second clock signal.

11. The device of claim 10, wherein the second transistor comprises a gate coupled to a third transistor and configured to receive the second clock signal.

12. The device of claim 11, wherein the third transistor is a PMOS transistor.

13. The device of claim 10, wherein the first circuit comprises a fourth transistor and a third transistor configured to cause the second transistor to disconnect a first node from a current source in response to the second clock signal.

14. The device of claim 10, wherein the first circuit comprises a voltage doubler circuit, the voltage doubler circuit being responsive to a third clock signal, the third clock signal being an inverted signal of the second clock signal.

15. The device of claim 14, wherein the voltage doubler circuit comprises an inverter configured to receive the third clock signal and provide a fourth clock signal, wherein the fourth clock signal is delayed and inverted with respect to the third clock signal.

16. A method of sampling an analog signal, the method comprising:
receiving the analog signal at a first input;
providing the analog signal to a first output in response to a first clock signal, the first clock signal having a level at least partially dependent on the analog signal; and
providing a path to a ground node to discharge the first clock signal in response to a presence of a second clock signal and prior to sampling of the analog signal, the second clock signal being independent of the analog signal, and wherein the first clock signal is delayed in accordance with a delay scheme that accounts for the second clock signal.

17. The method of claim 16, wherein the path to ground comprises a current source.

18. The method of claim 16, further comprising:
disconnecting a first node from the path to ground in response to the second clock signal, the first node being coupled to a transistor configured to provide the first clock signal.

19. The method of claim 16, wherein the first clock signal is provided using a voltage doubler circuit.

20. The method of claim 19, further comprising:
inverting a third clock signal to provide the second clock signal; and
wherein the voltage doubler circuit comprises an inverter configured to receive the third clock signal and provide a fourth clock signal, wherein the fourth clock signal is delayed and inverted with respect to the third clock signal.

21. A device comprising:
a first circuit configured to provide a first clock signal, the first clock signal having a first voltage level and a second voltage level, the second voltage level being above a third voltage level of a power node coupled to the first circuit; and
a second circuit coupled to the first circuit, the second circuit configured to sample an input signal at a first input in response to the first clock signal, wherein the first circuit comprises a first transistor, wherein the first transistor is configured to receive the first clock signal and is configured as a current source to provide a path to a ground node for the first clock signal in response to a second clock signal, where the first clock signal is delayed with respect to the second clock signal;
wherein the second circuit comprises a second transistor, a third transistor, and a fourth transistor configured to disconnect a first node from the first transistor in response to the second clock signal, wherein the first circuit is configured to provide the second clock signal to the first node, wherein the third transistor and the fourth transistor are in series and a second node between the third transistor and the fourth transistor is coupled to a gate of the second transistor and a drain of the fourth transistor, wherein a gate of the fourth transistor is configured to receive the second clock signal and the fourth transistor is a PMOS transistor and the third transistor is an NMOS transistor.

* * * * *